(12) United States Patent
Gorman et al.

(10) Patent No.: US 9,759,765 B2
(45) Date of Patent: Sep. 12, 2017

(54) INPUT/OUTPUT CELL, INTEGRATED CIRCUIT DEVICE AND METHODS OF PROVIDING ON-CHIP TEST FUNCTIONALITY

(71) Applicants: Alistair James Gorman, Dundee (GB); Carl Culshaw, Wigan (GB); Josef Maria Joachim Kruecken, Munich (DE)

(72) Inventors: Alistair James Gorman, Dundee (GB); Carl Culshaw, Wigan (GB); Josef Maria Joachim Kruecken, Munich (DE)

(73) Assignee: NXP USA, Inc., Austin, TX (US)

( * ) Notice: Subject to any disclaimer, the term of this patent is extended or adjusted under 35 U.S.C. 154(b) by 663 days.

(21) Appl. No.: 14/288,510

(22) Filed: May 28, 2014

(65) Prior Publication Data
US 2015/0346274 A1    Dec. 3, 2015

(51) Int. Cl.
*G01R 31/28*    (2006.01)
*H03K 17/687*    (2006.01)
*G01R 31/317*    (2006.01)

(52) U.S. Cl.
CPC ... *G01R 31/2856* (2013.01); *G01R 31/31715* (2013.01); *H03K 17/687* (2013.01); *H03K 2217/0063* (2013.01); *H03K 2217/0072* (2013.01)

(58) Field of Classification Search
CPC .......... G01R 31/28–31/2856; G01R 31/31715; H03K 17/687–17/6877; H03K 2017/6875; H03K 2217/0063–2217/0072
USPC .............................. 324/750.3, 762.01–765.01
See application file for complete search history.

(56) References Cited

U.S. PATENT DOCUMENTS

| | | |
|---|---|---|
| 6,260,163 B1 | 7/2001 | Lacroix et al. |
| 6,321,354 B1 | 11/2001 | Prunier |
| 6,718,407 B2 | 4/2004 | Martwick |
| 6,724,210 B2 | 4/2004 | Combs et al. |
| 6,847,203 B1 | 1/2005 | Conti et al. |
| 6,931,346 B2 | 8/2005 | Combs et al. |
| 7,010,733 B2 | 3/2006 | Bassett et al. |
| 7,274,203 B2 | 9/2007 | Tumin et al. |
| 7,405,586 B2 | 7/2008 | Gupta et al. |
| 8,072,820 B2 | 12/2011 | Gatzemeier et al. |

*Primary Examiner* — Melissa Koval
*Assistant Examiner* — Rahul Maini

(57) ABSTRACT

An I/O cell comprising a first set of driver stages comprising, each driver stage of the first set comprising a high side switch controllable to couple an I/O node of the I/O cell to a first high voltage supply node and a low side switch controllable to couple the I/O node of the I/O cell to a first low voltage supply node. The I/O cell further comprising a second set of driver stages, each driver stage of the second set comprising a high side switch controllable to couple the I/O node of the I/O cell to a second high voltage supply node and a low side switch controllable to couple the I/O node of the I/O cell to a second low voltage supply node. The switches of the first set of driver stages are controllable independently of the switches of the second set of driver stages.

11 Claims, 11 Drawing Sheets

INPUT/OUTPUT CELL, INTEGRATED CIRCUIT DEVICE AND METHODS OF PROVIDING ON-CHIP TEST FUNCTIONALITY

FIELD OF THE INVENTION

This invention relates to input/output cell for an integrated circuit, and more particularly to an integrated circuit having an input/output cell.

BACKGROUND OF THE INVENTION

In the field of integrated circuit design and fabrication, and in particular the field of microcontroller unit (MCU) design and fabrication, test throughput and test cost are highly dependent on the number of devices that can be tested in parallel. This is true for both packaged final testing and also for wafer level 'Known Good Die' (KGD) flow testing. The major factors that limit the number of devices that are able to be tested in parallel include:

the number of tester channels and resources available; and
the number of package contacts (hereinafter referred to simply as 'pins') on each device that need to be coupled to the tester channels and resources.

Developments in design for test techniques have reduced the number of tests that require every pin on a device to be coupled to a tester channel/resource. However, a small number of tests still require large numbers of pins to be coupled to tester channels/resources, thereby limiting the number of devices that can be tested in parallel. Examples of such tests include Zero Defects tests on all I/O pins such as:

I/O pad leakage tests;
digital input tests (Vil/Vih/Hysteresis)
drive strength (Ioh/Voh/Iol/Vol) tests;
etc.

Accordingly, there is a continual drive to improve testing techniques to reduce the number of pins required to be coupled to tester channels/resources during such tests, and thus that increase the number of devices that are able to be tested in parallel using the same tester configuration.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Figure 1:
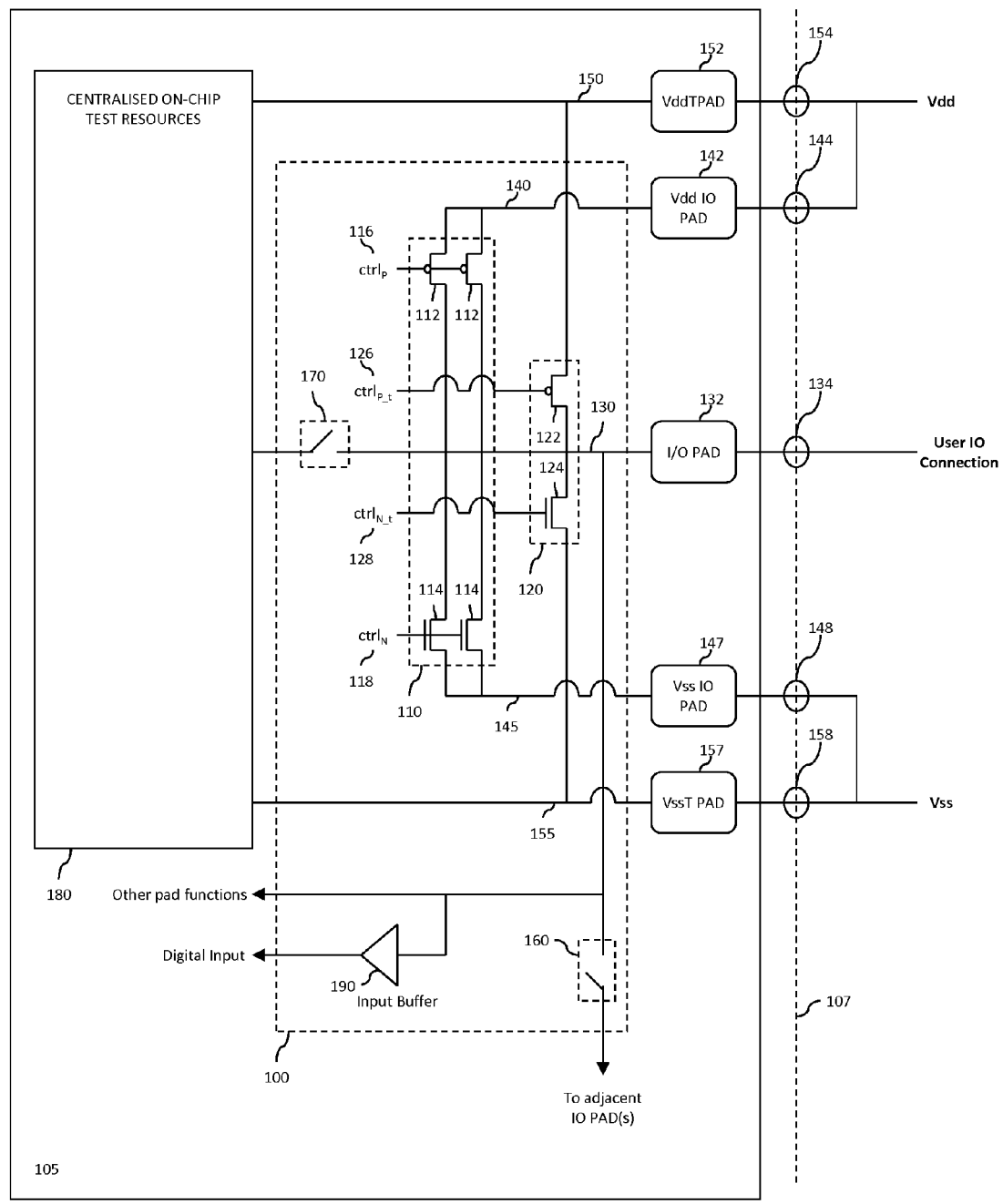
FIG. 1 illustrates a simplified block diagram of an example of an input/output (I/O) cell.

The present invention will now be described with reference to the accompanying drawings. However, it will be appreciated that the present invention is not limited to the specific examples herein described and illustrated in the accompanying drawings, and various modifications may be made without detracting from the inventive concept. For example, in the examples illustrated in the accompanying drawing, an integrated circuit device has been illustrated and herein described comprising input/output pads and voltage supply pads operably coupled to pins of an integrated circuit package within which the integrated circuit device has been mounted. However, it will be appreciated that for wafer level 'Known Good Die' (KGD) flow testing the integrated circuit device would not be mounted within an integrated circuit package, and as such the various pads would not be connected to pins of an integrated circuit package, but rather may be connected directly to test channels/resources etc.

Furthermore, because the illustrated embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

According to some examples of a first aspect of the present invention, there is provided an input/output (I/O) cell for an integrated circuit device. The I/O cell comprises a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node. The I/O cell further comprises a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node. The high side and low side switches of the first set of driver stages are controllable independently of the high side and low side switches of the second set of driver stages.

By providing an I/O cell with two separate sets of drive stages independently controllable and operably coupled to separate high and low voltage supply nodes in this manner, the ability to perform I/O tests on-chip without the need for all I/O pads to be connected to tester channels/resources is greatly improved, as described in greater detail below. As a result, test parallelism may be significantly improved, thereby improving test throughput and test cost.

According to some optional examples, the I/O cell may further comprise at least a first switching element operably coupled between the I/O node of the I/O cell and an I/O node of at least one adjacent I/O cell.

According to some optional examples, the I/O cell may further comprise at least a second switching element operably coupled between the I/O node of the I/O cell and at least one on-chip test resource.

According to some examples of a second aspect of the present invention, there is provided an integrated circuit device comprising at least one I/O cell according to the first aspect of the present invention.

According to some optional examples, the integrated circuit device may further comprise a plurality of I/O cells according to the first aspect of the invention, wherein:
  the I/O node of each I/O cell is operably coupled to a respective I/O pad;
  the first high voltage supply nodes of the I/O cells are operably coupled to at least a first high voltage supply pad of the integrated circuit device;
  the second high voltage supply nodes of the I/O cells are operably coupled to at least a second high voltage supply pad of the integrated circuit device;
  the first low voltage supply nodes of the I/O cells are operably coupled to at least a first low voltage supply pad of the integrated circuit device; and
  the second low voltage supply nodes of the I/O cells are operably coupled to at least a second low voltage supply pad of the integrated circuit device.

According to some optional examples, the integrated circuit device may further comprise at least one on-chip test resource operably coupled to the I/O node of the at least one I/O cell via the at least second switching element and arranged to perform a high output voltage drive strength test.

According to some optional examples, the at least one on-chip test resource may be arranged to:
  switch on the high side switches in the first and second sets of driver stages within the at least one I/O cell;
  switch off the at least one low side switch in the first set of driver stages within the at least one I/O cell;
  configure the at least one low side switch in the second set of driver stages within the at least one I/O cell to provide a load between the I/O node of the I/O cell and the second low voltage supply node;
  operably couple a current sink to the second low voltage supply node; and
  detect a voltage level at at least one of the I/O node of the at least one I/O cell and the second low voltage supply node.

According to some optional examples, the at least one on-chip test resource may be arranged to:
  switch on the low side switches in the first and second sets of driver stages within the at least one I/O cell;
  switch off the at least one high side switch in the first set of driver stages within the at least one I/O cell;
  configure the at least one high side switch in the second set of driver stages within the at least one I/O cell to provide a load between the I/O node of the I/O cell and the second high voltage supply node;
  operably couple a current source to the second high voltage supply node; and
  detect a voltage level at at least one of the I/O node of the at least one I/O cell and the second high voltage supply node.

According to some optional examples, the integrated circuit device may comprise at least one on-chip test resource operably coupled to the I/O node of the at least one I/O cell via the at least second switching element and arranged to detect leakage current at the I/O node of the at least one I/O cell.

According to some optional examples, the at least one on-chip test resource may be arranged to:
  operably couple one of a current sink and a current source to an input node of the at least one on-chip test resource;
  configure the at least second switching element of the at least one I/O cell to decouple the I/O node of the at least one I/O cell from the input node of the at least one on-chip test resource;
  detect a voltage level at the input node of the at least one on-chip test resource;
  configure the at least second switching element of the at least one I/O cell to operably couple the I/O node of the at least one I/O cell to the input node of the at least one on-chip test resource; and
  detect a voltage level at the input node of the at least one on-chip test resource.

According to some examples of a third aspect of the invention, there is provided a method of providing on-chip test functionality for at least one I/O cell within an integrated circuit device, the at least one I/O cell comprising:
  a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node; and
  a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node.

The method comprises:
  switching on the high side switches in the first and second sets of driver stages within the at least one I/O cell;
  switching off the at least one low side switch in the first set of driver stages within the at least one I/O cell;
  configuring the at least one low side switch in the second set of driver stages within the at least one I/O cell to provide a load between the I/O node of the I/O cell and the second low voltage supply node;
  operably coupling a current sink to the second low voltage supply node; and
  detecting a voltage level at at least one of the I/O node of the at least one I/O cell and the second low voltage supply node.

According to some examples of a fourth aspect of the invention, there is provided a method of providing on-chip test functionality for at least one I/O cell within an integrated circuit device, the at least one I/O cell comprising:

a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node; and a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node.

The method comprises:

switching on the low side switches in the first and second sets of driver stages within the at least one I/O cell;

switching off the at least one high side switch in the first set of driver stages within the at least one I/O cell;

configuring the at least one high side switch in the second set of driver stages within the at least one I/O cell to provide a load between the I/O node of the I/O cell and the second high voltage supply node;

operably coupling a current source to the second high voltage supply node; and detecting a voltage level at at least one of the I/O node of the at least one I/O cell and the second high voltage supply node.

According to some examples of a fifth aspect of the invention, there is provided a method of providing on-chip test functionality for at least one I/O cell within an integrated circuit device. The at least one I/O cell comprises:

a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node;

a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node; and at least one switching element operably coupled between the I/O node of the I/O cell and at least one on-chip test resource.

The method comprises:

operably coupling one of a current sink and a current source to an input node of the at least one on-chip test resource;

configuring the at least one switching element of the at least one I/O cell to decouple the I/O node of the at least one I/O cell from the input node of the at least one on-chip test resource;

detect a voltage level at the input node of the at least one on-chip test resource;

configure the at least one switching element of the at least one I/O cell to operably couple the I/O node of the at least one I/O cell to the input node of the at least one on-chip test resource; and detecting a voltage level at the input node of the at least one on-chip test resource.

According to some examples of a sixth aspect of the invention, there is provided a method of providing on-chip test functionality for a plurality of I/O cells within an integrated circuit device. Each I/O cell comprises:

a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node;

a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node; and at least one switching element operably coupled between the I/O node of the I/O cell and an I/O node of at least one adjacent I/O cell.

The method comprises:

configuring the switching elements into a closed configuration to operably couple together I/O nodes of adjacent I/O cells such that the I/O nodes of the I/O cells are operably coupled in a chain;

measuring at least one I/O characteristic at an I/O pad operably coupled to an I/O node of one of the I/O cells within the chain of I/O cells; and iteratively configuring a switching element within an I/O cell at an end of the chain of I/O cells to decouple the I/O node of the I/O cell at the end of the chain and re-measuring the at least one I/O characteristic at the I/O node of the one of the I/O cells within the chain of I/O cells upon each decoupling of an I/O node of an I/O cell at the end of the chain.

Referring now to FIG. 1, there is illustrated a simplified block diagram of an example of an input/output (I/O) cell 100 such as may be implemented within an integrated circuit device 105 such as, say, a microprocessor, microcontroller unit (MCU), digital signal processor (DSP) or the like. The I/O cell 100 comprises a first set of driver stages 110. Each driver stage of the first set 110 comprises a high side switch 112 controllable to couple an I/O node 130 of the I/O cell 100 to a first high voltage supply node 140, and a low side switch 114 controllable to couple the I/O node 130 of the I/O cell 100 to a first low voltage supply node 145.

The I/O cell 100 further comprises a second set of driver stages 120. Each driver stage of the second set 120 comprises a high side switch 122 controllable to couple the I/O node 130 of the I/O cell 100 to a second high voltage supply node 150, and a low side switch 124 controllable to couple the I/O node 130 of the I/O cell 100 to a second low voltage supply node 155. The high side and low side switches 112, 114 of the first set of driver stages 110 are controllable independently of the high side and low side switches 122, 124 of the second set of driver stages 120; the high side and low side switches 112, 114 of the first set of driver stages 110 being controllable by way of a first set of control signals 116, 118 whilst the high side and low side switches 122, 124 of the second set of driver stages 120 being controllable by way of a second set of control signals 126, 128.

In the illustrated example, the I/O node 130 of the I/O cell 100 is operably coupled to an I/O pad 132 of the integrated circuit device 105, which in turn is arranged to be operably coupled to an I/O pin 134 of an integrated circuit package 107 within which the integrated circuit device 105 is mounted. The first high voltage supply node 140 is operably coupled to a first high voltage supply pad 142 of the integrated circuit device 105, which in turn is arranged to be operably coupled to a first high voltage supply pin 144 of the integrated circuit package 107. The first low voltage supply node 145 is operably coupled to a first low voltage supply pad 147 of the integrated circuit device 105, which in turn is arranged to be operably coupled to a first high voltage supply pin 148 of the integrated circuit package 107. The second high voltage supply node 150 is operably coupled to a second high voltage supply pad 152 of the integrated circuit device 105, which in turn is arranged to be operably coupled to a second high voltage supply pin 154 of the integrated circuit package 107. The second low voltage supply node 155 is operably coupled to a second low voltage supply pad 157 of the integrated circuit device 105, which in turn is arranged to be operably coupled to a second high voltage supply pin 158 of the integrated circuit package 107.

As illustrated in FIG. 1, there is substantially no direct coupling between the first and second high voltage supply nodes 142, 152 within the integrated circuit device 105. Similarly, there is substantially no direct coupling between the first and second low voltage supply nodes 147, 157 within the integrated circuit device 105. During normal operation of the I/O cell, for example in a typical user configured operating mode, the first and second high voltage supply nodes 142, 152 may be operably coupled to a common external high voltage supply Vdd, and the first and second low voltage supply nodes 147, 157 may be operably coupled to a common external low voltage supply Vss, as illustrated in FIG. 1. In this manner, by applying the same control signals to the first and second sets of control signals 116, 118, 126, 128, the first and second sets of drive stages 110, 120 will operate in a complementary manner allowing both sets of drive stages 110, 120 to be used to drive an output signal at the output node 130 for the I/O cell 100, in a manner similar to a conventional I/O cell.

In some examples, the integrated circuit device 105 may comprise a plurality of such I/O cells 100. In such examples, the I/O node of each I/O cell 100 may be operably coupled to a respective I/O pad 132, for example such that there is a one-to-one relationship between the plurality of I/O cells 100 and a plurality of I/O pads 132. Furthermore, in some examples the first high voltage supply nodes 140 of the plurality of I/O cells 100 may be operably coupled to a common first high voltage supply pad 142 of the integrated circuit device 105, the second high voltage supply nodes 150 of the plurality of I/O cells 100 may be operably coupled to a common second high voltage supply pad 152 of the integrated circuit device 105, the first low voltage supply nodes 150 of the plurality of I/O cells 100 may be operably coupled to a common first low voltage supply pad 152 of the integrated circuit device 105, and the second low voltage supply nodes 155 of the plurality of I/O cells 100 may be operably coupled to a common second low voltage supply pad 157 of the integrated circuit device 105.

In the example illustrated in FIG. 1, the I/O cell 100 further comprises a first switching element 160 operably coupled between the I/O node 130 of the I/O cell 100 and an I/O node of an adjacent I/O cell (not shown). In this manner, the I/O nodes 130 of multiple I/O cells may be selectively coupled in a chain.

For completeness, the I/O cell 100 further comprises an input buffer 190 comprising an input operably coupled to the I/O node 130, and arranged to output a digital input signal based on the detected voltage level at the I/O node 130.

Figure 2:
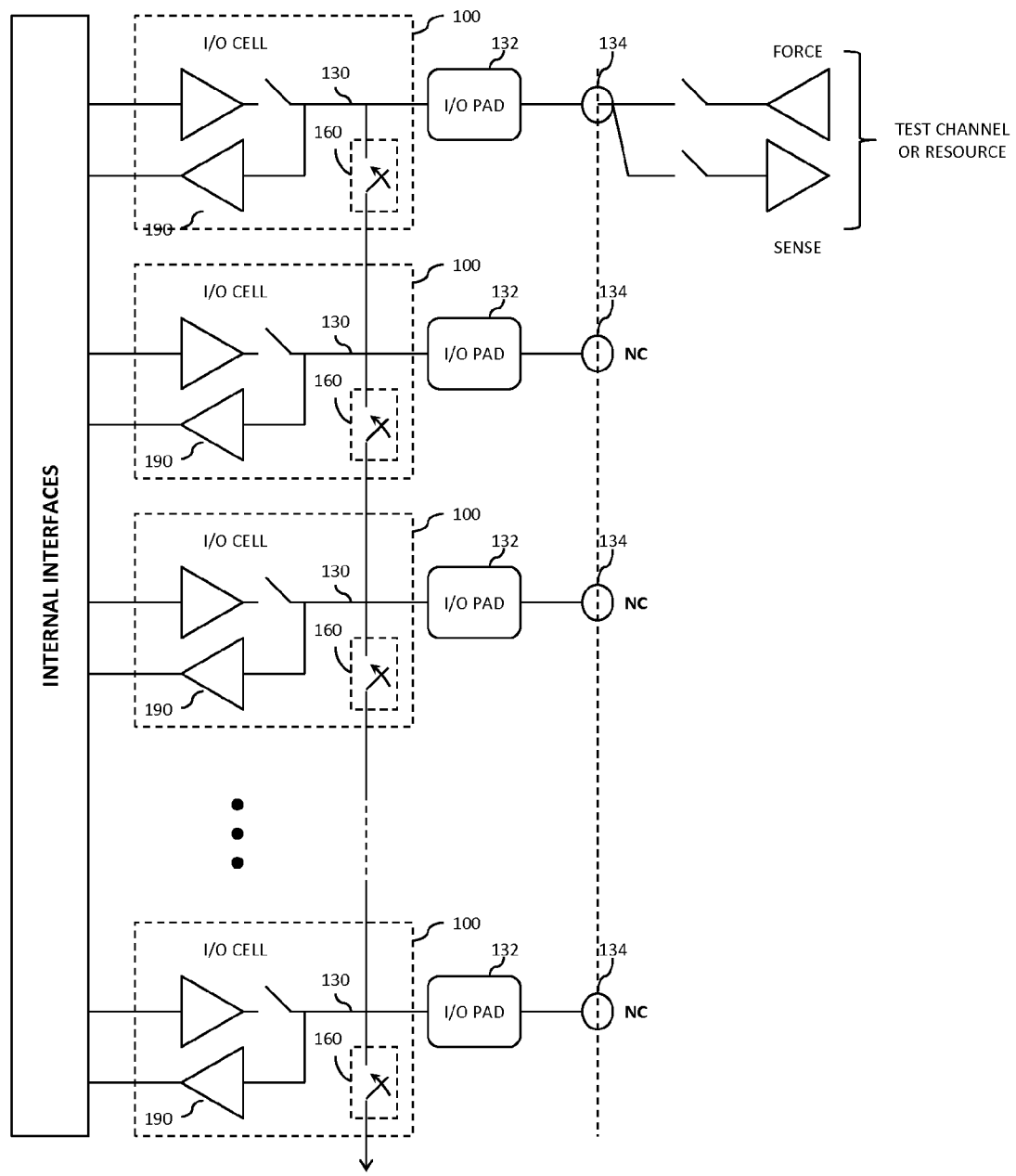
FIG. 2 illustrates a simplified block diagram of an example of the use of a plurality of the I/O cells illustrated in FIG. 1 to facilitate testing of an integrated circuit device.

FIG. 2 illustrates a simplified block diagram of an example of the use of a plurality of the I/O cells 100 illustrated in FIG. 1 to facilitate testing of an integrated circuit device. Conventionally, in order to test certain I/O characteristics for an integrated circuit device, such as current leakage, digital input voltage level (Vil/Vih) and hysteresis tests or the like, every I/O pin 134 was required to be operably coupled to a test channel/resource of external automated test equipment. This need for a test channel/resource to be taken up for every I/O pin 134 severely limited test parallelism. For example, testing of an integrated circuit design comprising 120 I/O pins using standard automated test equipment comprising, for example, 1024 test channels meant that only eight devices could be tested in parallel.

In the example illustrated in FIG. 2, during testing the first switching elements 160 within the plurality of I/O cells 100 may be initially configured into a closed configuration to operably couple together I/O nodes 130 of adjacent I/O cells 100 such that the I/O nodes 130 of the I/O cells 100 are operably coupled in a chain. One or more I/O characteristic(s) may then be measured at a single I/O pad 132, the measured I/O characteristic(s) being representative of the combined I/O characteristics of the I/O cells 100 in the chain. For example, in the case where the I/O characteristic being measured is current leakage, the measured current leakage will be representative of the combined current leakage within all of the chained I/O cells 100.

Having measured the combined I/O characteristic(s) for the complete chain of I/O cells 100, the first switching elements 160 of the chained I/O cells 100 may be sequentially configured into an open configuration to sequentially decouple their respective I/O cells 100 from the chain of I/O cells 100, and the I/O characteristic(s) re-measured at the single I/O pad 132 upon each decoupling of an I/O cell 100. In this manner, by comparing each characteristic measurement to the previous measurement, individual I/O characteristics may be derived for each individual I/O cell 100 using only a single test channel/resource.

Alternatively, when the first switching elements 160 within the plurality of I/O cells 100 are configured into a closed configuration to operably couple together I/O nodes 130 of adjacent I/O cells 100 such that the I/O nodes 130 of the I/O cells 100 are operably coupled in a chain, a single I/O pad 132 may be used to perform digital input voltage level (Vil/Vih) and hysteresis tests for all of the I/O cells 100 within the chain. For clarity, Vih is the voltage level at the input of the input buffer 190 of an I/O cell 100 below which the input buffer 190 detects (and therefore outputs) a logical '1' value. Conversely Vil is the voltage level at the input of the input buffer 190 of an I/O cell 100 above which the input buffer 190 detects (and outputs) a logical '0' value. A test resource operably coupled to the I/O pad 132 may be arranged to apply a test voltage to the I/O pad 132. This test voltage would thus be applied to all of the I/O nodes 130 within the chain of I/O cells 100. By reading the digital input signals output by the respective input buffers 190 of the I/O cells 100 within the chain, their respective level ("0" or "1") may be determined and can be compared to the expected level for the test voltage applied to the I/O pad 132. By ramping the test voltage applied to the I/O pad 132 up and down, the digital input voltage level values Vil, Vih and input hysteresis can be exactly measured for each I/O cell.

Referring back to FIG. 1, in the illustrated example the I/O cell 100 further comprises a second switching element 170 operably coupled between the I/O node 130 of the I/O cell 100 and one or more on-chip test resource(s) 180. In this manner, the I/O node 130 of the I/O cell 100 may be selectively coupled to the on-chip test resource(s) 180 to enable one or more tests required to be performed in relation to the I/O cell to be performed using the on-chip test resource(s) 180.

Figure 3:
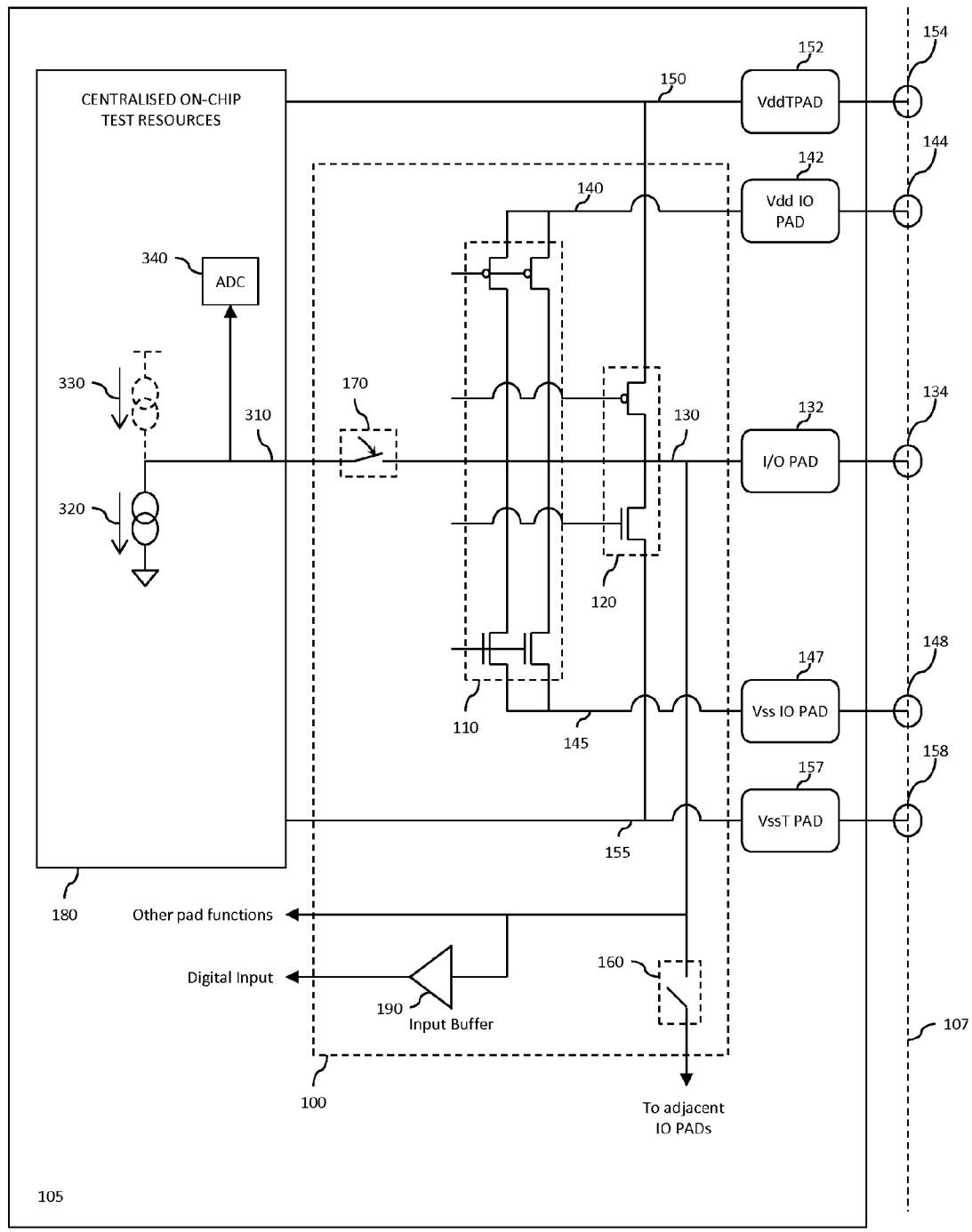
FIG. 3 illustrates a simplified block diagram of first example of the use of on-chip test resource(s) to facilitate current leakage testing of the I/O cell illustrated in FIG. 1.

FIG. 3 illustrates a simplified block diagram of first example of the use of on-chip test resource(s) 180 to facilitate current leakage testing of the I/O cell 100 illustrated in FIG. 1. In the example illustrated in FIG. 3, the on-chip test resources 180 are arranged to operably couple one of a current sink 320 and a current source 330 to an input node 310 of the on-chip test resources 180. The on-chip test resources 180 are further arranged to initially configure the second switching element 170 to decouple the I/O node 130 of the I/O cell 100 from the on-chip test resources 180, and to detect a voltage level at the input node 310 of the on-chip test resources 180 with the I/O node 130 of the I/O cell 100 decoupled therefrom. In the illustrated example, the voltage level at the input node 310 of the on-chip test resources 180 is performed by an analogue to digital converter (ADC) component 340. The on-chip test resources 180 are then arranged to configure the second switching element 170 to operably couple the I/O node 130 of the I/O cell 100 to the input node 310 of the on-chip test resources 180, and to detect a voltage level at the input node 310 of the on-chip test resources 180 with the I/O node 130 of the I/O cell 100 operably coupled thereto.

In this manner, the on-chip test resources 180 may detect changes in the voltage level at the input node 310 of the on-chip test resources 180 between the I/O node 130 of the I/O cell 100 decoupled therefrom and operably coupled thereto. In this manner, leakage current at the I/O node 130 of the I/O cell 100 may be measured without the need to connect the I/O pin 134 to an external test channel/resource.

Figure 4:
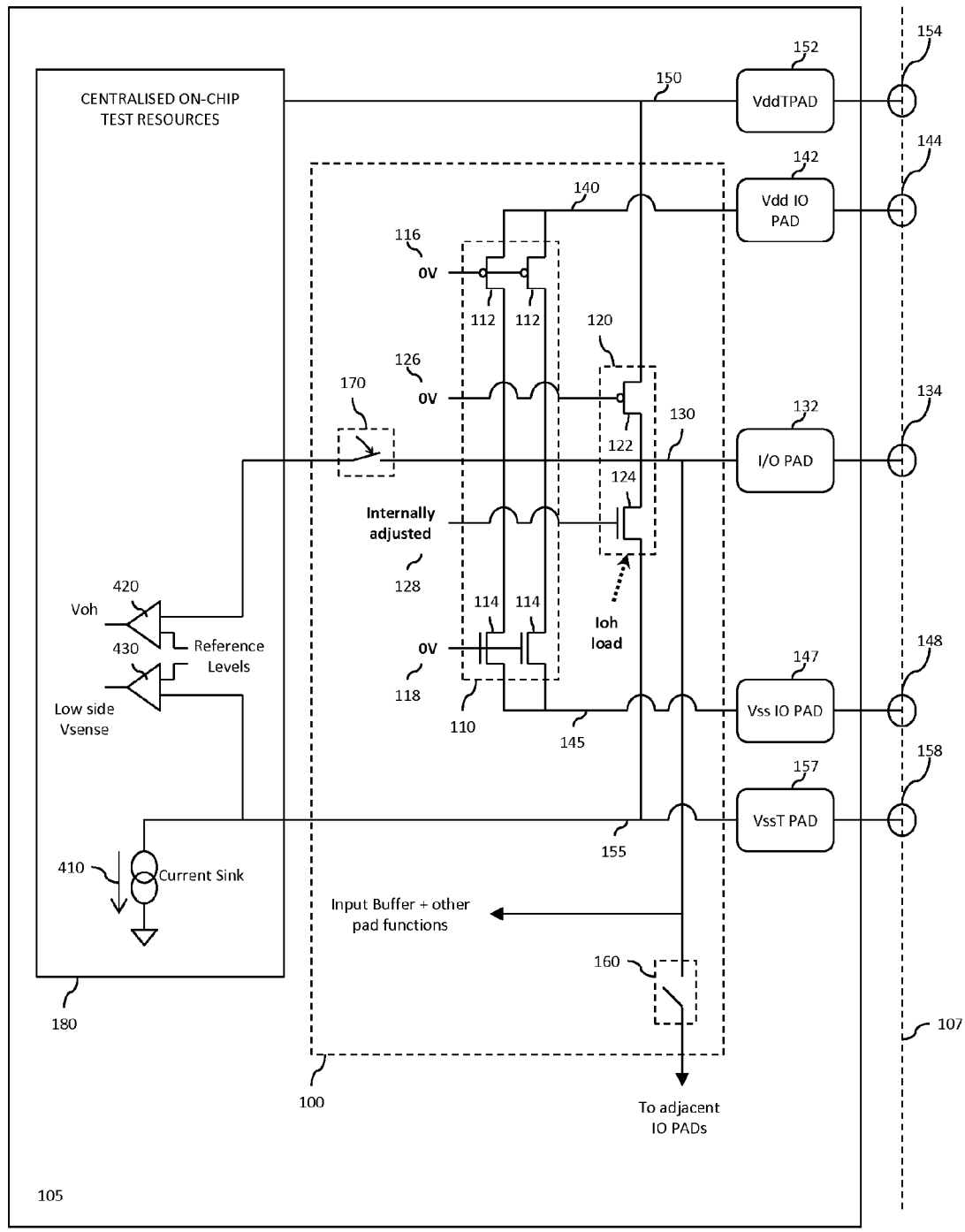
FIG. 4 illustrates a simplified block diagram of an example of the use of on-chip test resource(s) to facilitate drive strength testing of the I/O cell illustrated in FIG. 1.

FIG. 4 illustrates a simplified block diagram of an example of the use of on-chip test resource(s) 180 to facilitate drive strength testing of the I/O cell 100 illustrated in FIG. 1, and more specifically high side drive strength testing. In the example illustrated in FIG. 4, the second switching element 170 is configured to operably couple the I/O node 130 of the I/O cell 100 to the on-chip test resources 180. The on-chip resources 180 are arranged to configure the control signals 116, 118, 126, 128 of the drive stages 110, 120 of the I/O cell 100 to:
  switch on the high side switches 112, 122 in the first and second sets of driver stages 110, 120;
  switch off the low side switch(es) 114 in the first set of driver stages 110;
  configure the low side switch(es) 124 in the second set of driver stages 120 to provide a load (Ioh load) between the I/O node 130 of the I/O cell 100 and the second low voltage supply node 155.

The on-chip resources 180 are further arranged to operably couple a current sink 410 to the second low voltage supply node 155, and detect a voltage level at each of the I/O node 130 and the second low voltage supply node 155. In the example illustrated in FIG. 4, the on-chip resources 180 are arranged to detect the voltage levels at the I/O node 130 and the second low voltage supply node 155 using comparators 420, 430, which compare the voltage levels at the I/O node 130 and the second low voltage supply node 155 to respective configurable reference levels to determine whether the voltage levels at the respective I/O node 130 and the second low voltage supply node 155 are greater than or less than the respective reference level. In this manner, the first comparator 420 is arranged to detect whether a high side output voltage (Voh) of the I/O cell 100 (i.e. the voltage at the I/O node 130) exceeds the respective voltage reference level. Conversely, the voltage level at the second low voltage supply node 155 provides an indication of the high side output current (Ioh) of the I/O cell 100, and the second comparator 420 is arranged to detect whether the high side output current (Ioh) of the I/O cell 100 exceeds a reference level represented by the respective voltage reference level.

Figure 5:
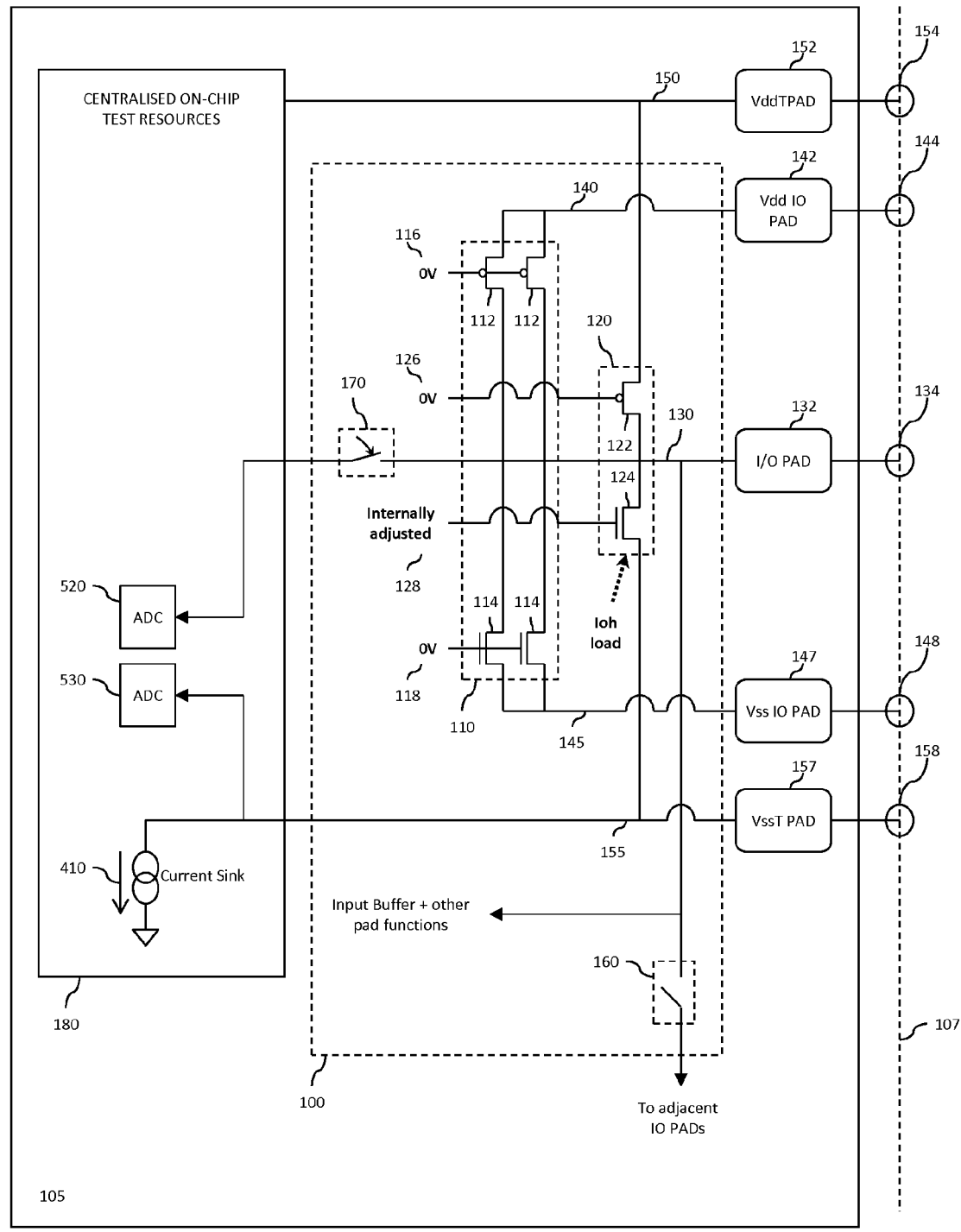
FIG. 5 illustrates a simplified block diagram of an alternative example of the use of on-chip test resource(s) to facilitate drive strength testing of the I/O cell illustrated in FIG. 1.

FIG. 5 illustrates a simplified block diagram of an alternative example of the use of on-chip test resource(s) 180 to facilitate high side drive strength testing of the I/O cell 100 illustrated in FIG. 1. As for the example illustrated in FIG. 4, the second switching element 170 is configured to operably couple the I/O node 130 of the I/O cell 100 to the on-chip test resources 180. The on-chip resources 180 are arranged to configure the control signals 116, 118, 126, 128 of the drive stages 110, 120 of the I/O cell 100 to:
  switch on the high side switches 112, 122 in the first and second sets of driver stages 110, 120;
  switch off the low side switch(es) 114 in the first set of driver stages 110;
  configure the low side switch(es) 124 in the second set of driver stages 120 to provide a load (Ioh load) between the I/O node 130 of the I/O cell 100 and the second low voltage supply node 155.

The on-chip resources 180 are arranged to operably couple a current sink 410 to the second low voltage supply node 155, and detect a voltage level at each of the I/O node 130 and the second low voltage supply node 155.

In the example illustrated in FIG. 5, the on-chip resources 180 are arranged to detect the voltage levels at the I/O node 130 and the second low voltage supply node 155 using ADC components 520, 530.

Figure 6:
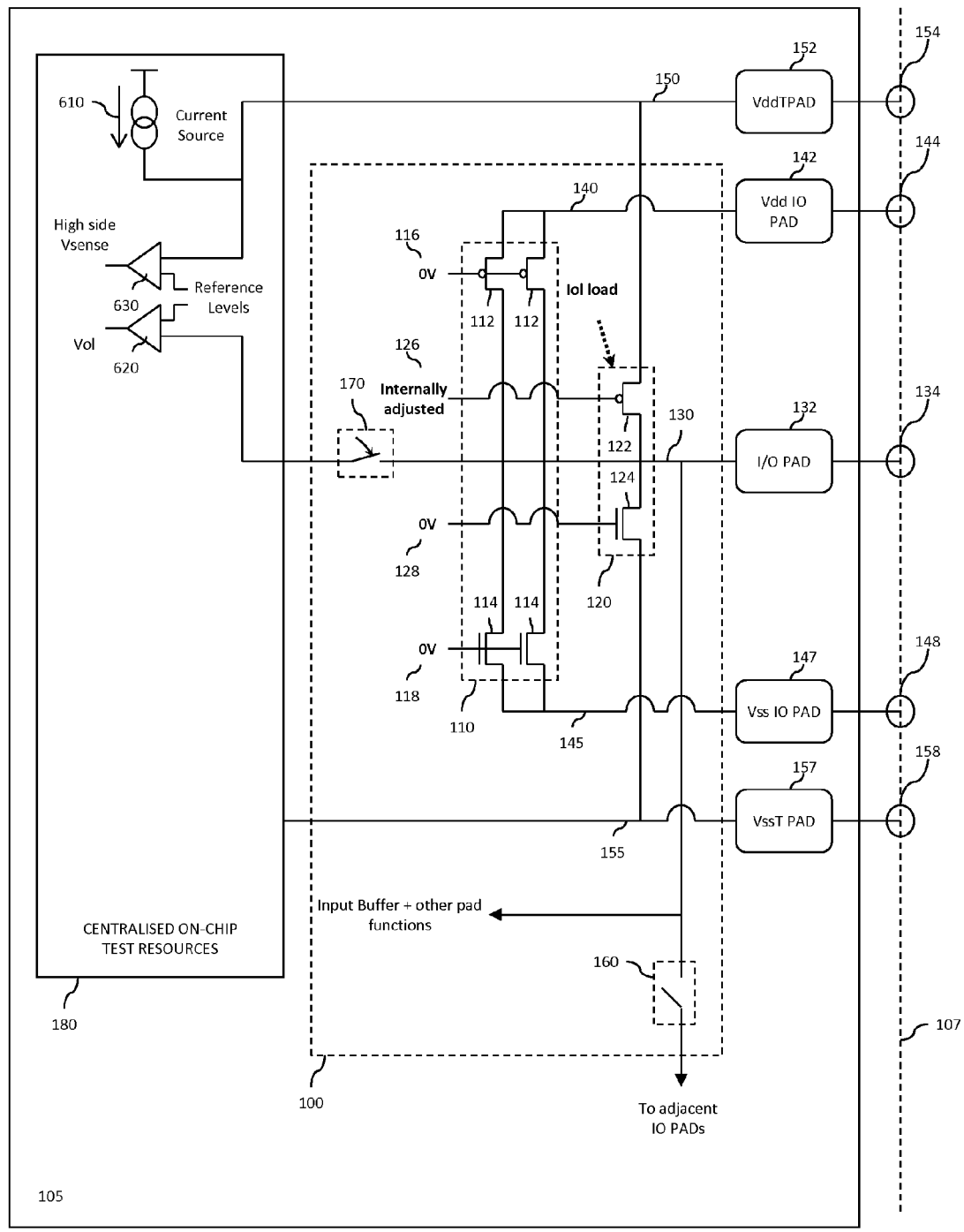
FIG. 6 illustrates a simplified block diagram of a further alternative example of the use of on-chip test resource(s) to facilitate drive strength testing of the I/O cell illustrated in FIG. 1.

FIG. 6 illustrates a simplified block diagram of a further alternative example of the use of on-chip test resource(s) 180 to facilitate drive strength testing of the I/O cell 100 illustrated in FIG. 1, and more specifically low side drive strength testing. In the example illustrated in FIG. 6, the second switching element 170 is configured to operably couple the I/O node 130 of the I/O cell 100 to the on-chip test resources 180. The on-chip resources 180 are arranged to configure the control signals 116, 118, 126, 128 of the drive stages 110, 120 of the I/O cell 100 to:
  switch on the low side switches 114, 124 in the first and second sets of driver stages 110, 120;
  switch off the high side switch(es) 112 in the first set of driver stages 110;
  configure the high side switch(es) 122 in the second set of driver stages 120 to provide a load (Iol load) between the I/O node 130 of the I/O cell 100 and the second high voltage supply node 150.

The on-chip resources 180 are further arranged to operably couple a current source 610 to the second high voltage supply node 150, and detect a voltage level at each of the I/O node 130 and the second high voltage supply node 150. In the example illustrated in FIG. 6, the on-chip resources 180 are arranged to detect the voltage levels at the I/O node 130 and the second high voltage supply node 150 using comparators 620, 630, which compare the voltage levels at the I/O node 130 and the second high voltage supply node 150 to respective configurable reference levels to determine whether the voltage levels at the respective I/O node 130 and the second high voltage supply node 150 are greater than or less than the respective reference level. In this manner, the first comparator 620 is arranged to detect whether a low side output voltage (Vol) of the I/O cell 100 (i.e. the voltage at the I/O node 130) exceeds the respective voltage reference level. Conversely, the voltage level at the second high voltage supply node 150 provides an indication of the low side output current (Iol) of the I/O cell 100, and the second comparator 620 is arranged to detect whether the low side output current (Iol) of the I/O cell 100 exceeds a reference level represented by the respective voltage reference level.

Figure 7:
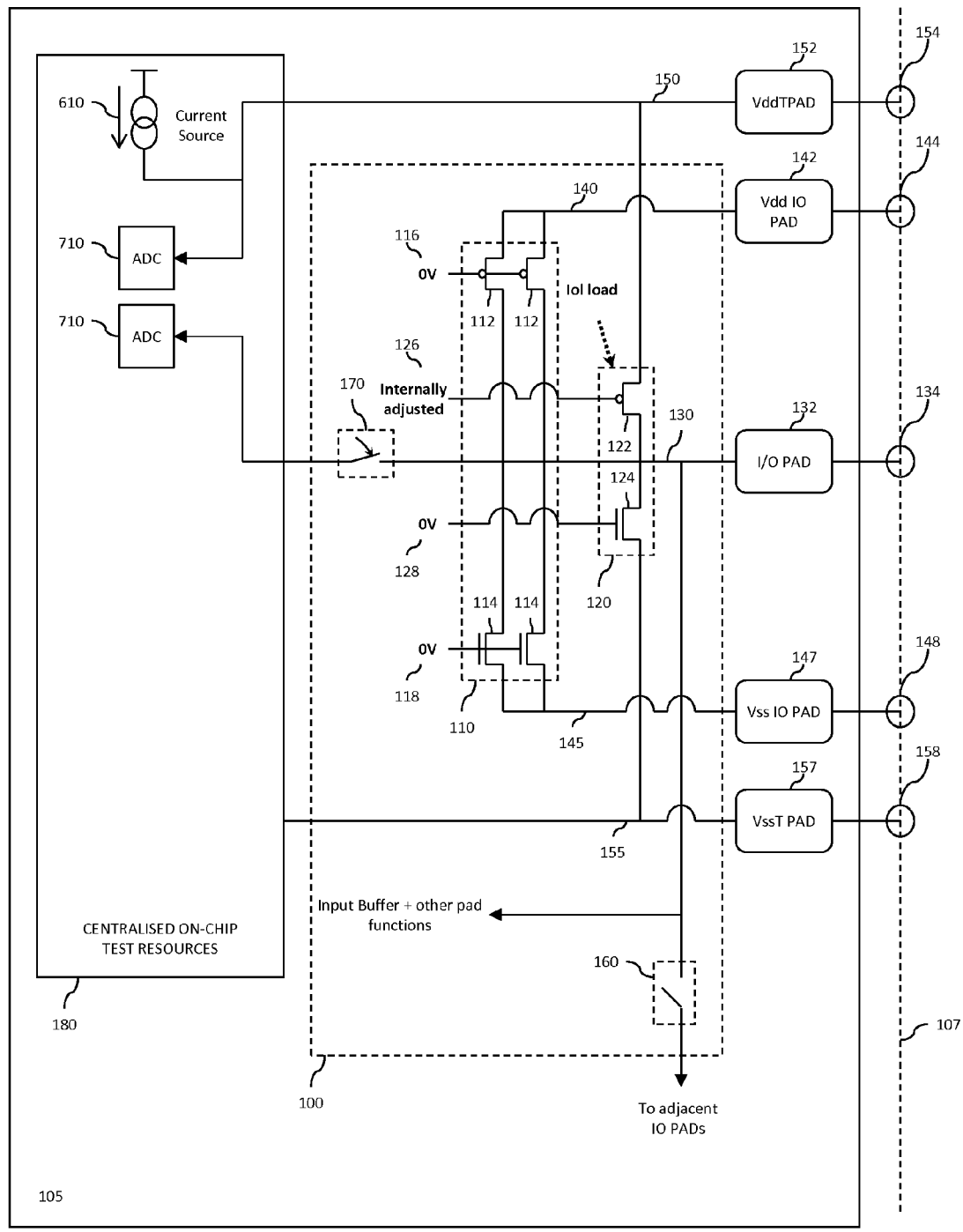
FIG. 7 illustrates a simplified block diagram of a still further alternative example of the use of on-chip test resource(s) to facilitate drive strength testing of the I/O cell 100 illustrated in FIG. 1.

FIG. 7 illustrates a simplified block diagram of an alternative example of the use of on-chip test resource(s) 180 to facilitate low side drive strength testing of the I/O cell 100 illustrated in FIG. 1. As for the example illustrated in FIG. 6, the second switching element 170 is configured to operably couple the I/O node 130 of the I/O cell 100 to the on-chip test resources 180. The on-chip resources 180 are arranged to configure the control signals 116, 118, 126, 128 of the drive stages 110, 120 of the I/O cell 100 to:
  switch on the low side switches 114, 124 in the first and second sets of driver stages 110, 120;
  switch off the high side switch(es) 112 in the first set of driver stages 110;
  configure the high side switch(es) 122 in the second set of driver stages 120 to provide a load (Iol load) between the I/O node 130 of the I/O cell 100 and the second high voltage supply node 150.

The on-chip resources 180 are further arranged to operably couple a current source 610 to the second high voltage supply node 150, and detect a voltage level at each of the I/O node 130 and the second high voltage supply node 150.

In the example illustrated in FIG. 7, the on-chip resources 180 are arranged to detect the voltage levels at the I/O node 130 and the second high voltage supply node 150 using ADC components 720, 730.

In the examples illustrated in FIGS. 4 to 7, the on-chip resources 180 have been illustrated and described as comprising pairs of comparators 420, 430, 620, 630 or pairs of ADC components 520, 530, 720, 730 for detecting the respective voltage levels. However, it is contemplated that in each example a single comparator or ADC component with multiplexed channels may alternatively be implemented.

Figure 8:
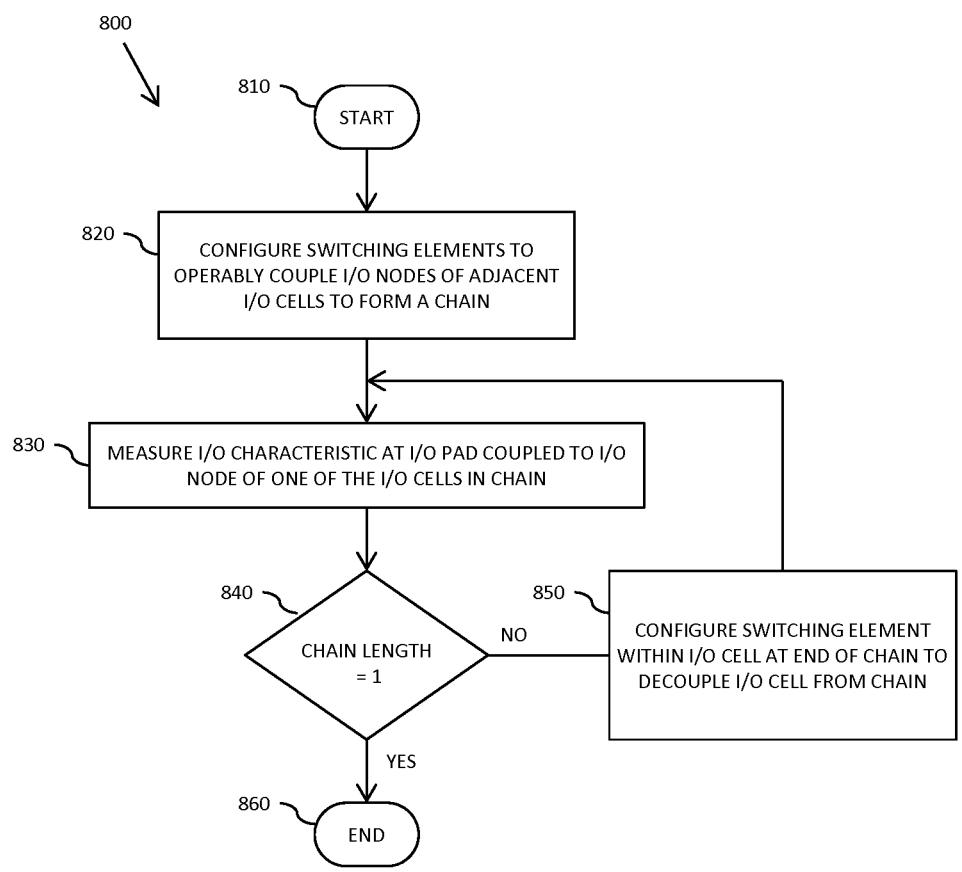
FIG. 8 illustrates a simplified flowchart of an example of a method of providing on-chip test functionality for at least one I/O cell within an integrated circuit device.

Referring now to FIG. 8 there is illustrated a simplified flowchart 800 of an example of a method of providing on-chip test functionality for a plurality of I/O cells within an integrated circuit device, for example as may be implemented with a plurality of the I/O cell illustrated in FIG. 1. In particular, the method relates to a method of providing on-chip test functionality for a plurality of I/O cells within an integrated circuit device, each I/O cell comprising:
  a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node;
  a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node; and
  at least one switching element operably coupled between the I/O node of the I/O cell and an I/O node of at least one adjacent I/O cell.

The method starts at 810, and moves on to 820 where the switching elements are configured into a closed configuration to operably couple together I/O nodes of adjacent I/O cells such that the I/O nodes of the I/O cells are operably coupled in a chain. Next, at 830, at least one I/O characteristic is measured at an I/O pad operably coupled to an I/O node of one of the I/O cells within the chain of I/O cells. Examples of such I/O characteristics may include, by way of example only, current leakage, etc.

In the illustrated example, the method then moves on to 840 where it is determined how many I/O cells are coupled together in the chain. If the chain length is one (i.e. only a single I/O cell is present within the chain) then the method ends at 860. However, if the chain length is not equal to one (i.e. is greater than one), the method moves on to 850 where a switching element within an I/O cell at an end of the chain of I/O cells is configured to decouple the I/O node of the I/O cell at the end of the chain. The method then loops back to 830, where the at least one I/O characteristic is re-measured. In this manner, the method is arranged to iteratively configure switching elements within the chain of I/O cells to sequentially decouple I/O cells from the chain, whilst re-measuring the at least one I/O characteristic each time an I/O cell is decoupled.

Figure 9:
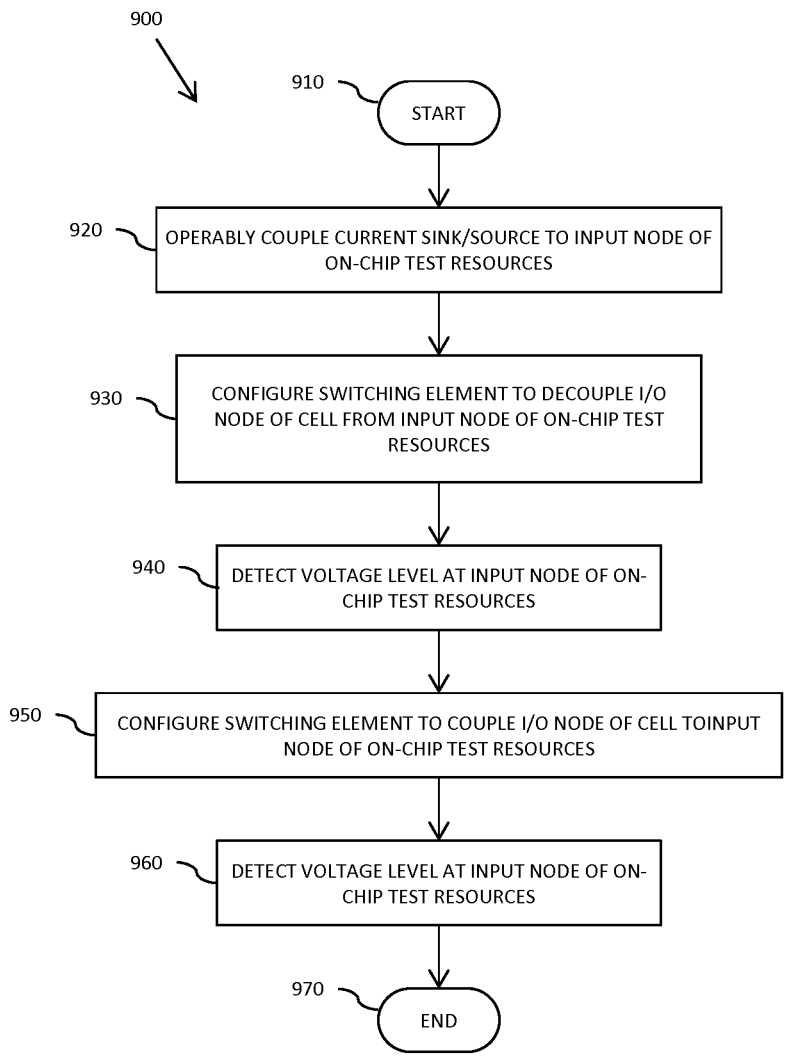
FIG. 9 illustrates a simplified flowchart of an alternative example of a method of providing on-chip test functionality for at least one I/O cell within an integrated circuit device.

Referring now to FIG. 9, there is illustrated a simplified flowchart 900 of an example of a method of providing on-chip test functionality for at least one I/O cell within an integrated circuit device, such as the I/O cell illustrated in FIG. 1. In particular, the method relates to a method of providing on-chip test functionality for at least one I/O cell within an integrated circuit device, each I/O cell comprising:
  a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node;
  a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node; and
  at least one switching element operably coupled between the I/O node of the I/O cell and at least one on-chip test resource.

The method starts at 910, and moves on to 920 where a current sink or a current source is operably coupled to an input node of the on-chip test resource(s). Next, at 930, the switching element is configured to decouple the I/O node of the I/O cell from the input node of the on-chip test resource(s). A voltage level is then detected at the input node of the on-chip test resource(s), at 940. The method then moves on to 950, where the switching element of the I/O cell is configured to operably couple the I/O node of the I/O cell to the input node of the on-chip test resource(s). A voltage level is then detected at the input node of the on-chip test resource(s), at 960, and the method ends at 970.

Figure 10:
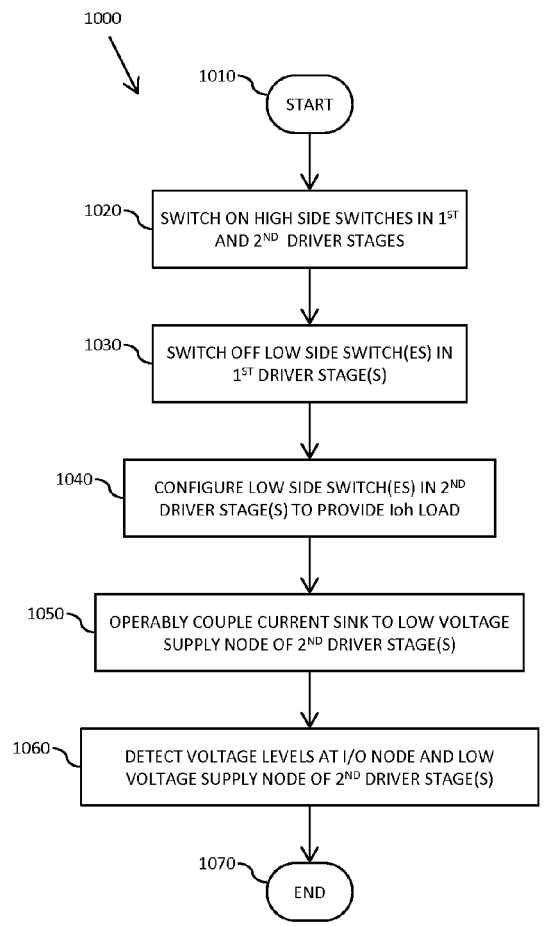
FIG. 10 illustrates a simplified flowchart of a further alternative example of a method of providing on-chip test functionality for at least one I/O cell within an integrated circuit device.

Referring now to FIG. 10, there is illustrated a simplified flowchart 1000 of an alternative example of a method of providing on-chip test functionality for at least one I/O cell within an integrated circuit device, such as the I/O cell illustrated in FIG. 1. In particular, the method relates to a method of providing on-chip test functionality for at least one I/O cell within an integrated circuit device, each I/O cell comprising:
  a first set of driver stages comprising at least one driver stage; each driver stage of the first set comprising a high side switch controllable to couple an input/output node of the input/output cell to a first high voltage supply node and a low side switch controllable to couple the input/output node of the input/output cell to a first low voltage supply node; and
  a second set of driver stages comprising at least one driver stage; each driver stage of the second set comprising a high side switch controllable to couple the input/output node of the input/output cell to a second high voltage supply node and a low side switch controllable to couple the input/output node of the input/output cell to a second low voltage supply node.

The method starts at 1010, and moves on to 1020 where the high side switches in the first and second sets of driver stages are switched on. The low side switch(es) in the first set of driver stages is/are switched off at 1030, and the low side switch(es) in the second set of driver stages is/are configured to provide a load between the I/O node of the I/O cell and the second low voltage supply node at 1040. A current sink is then operably coupled to the second low voltage supply node at 1050, and a voltage level at at least one of the I/O node and the second low voltage supply node is detected at 1060. The method then ends at 1070.

Figure 11:
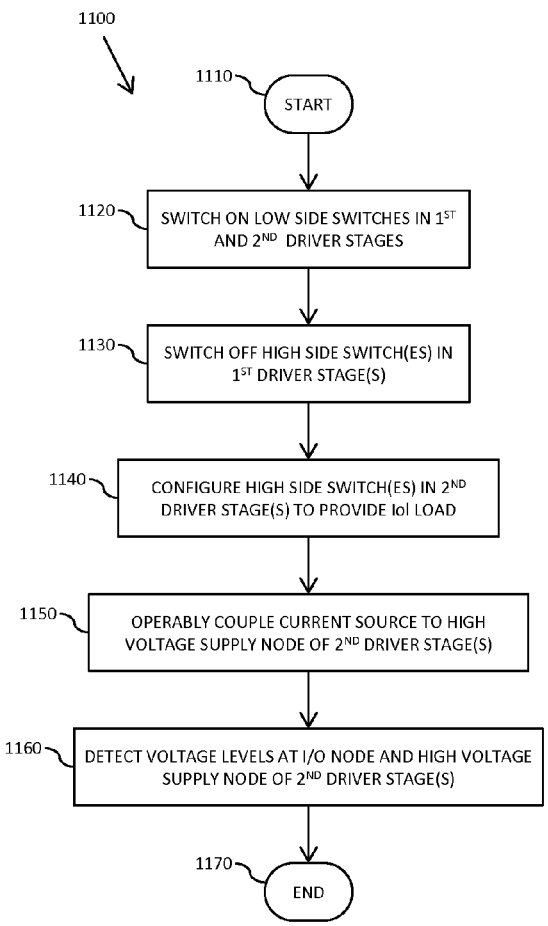
FIG. 11 illustrates a simplified flowchart of a still further alternative example of a method of providing on-chip test functionality for at least one I/O cell within an integrated circuit device.

Referring now to FIG. 11, there is illustrated a simplified flowchart 1100 of a further alternative example of a method of providing on-chip test functionality for at least one I/O cell within an integrated circuit device, such as the I/O cell illustrated in FIG. 1. In particular, the method relates to a method of providing on-chip test functionality for at least one I/O cell within an integrated circuit device, each I/O cell comprising:

- a first set of driver stages comprising at least one driver stage; each driver stage of the first set comprising a high side switch controllable to couple an input/output node of the input/output cell to a first high voltage supply node and a low side switch controllable to couple the input/output node of the input/output cell to a first low voltage supply node; and
- a second set of driver stages comprising at least one driver stage; each driver stage of the second set comprising a high side switch controllable to couple the input/output node of the input/output cell to a second high voltage supply node and a low side switch controllable to couple the input/output node of the input/output cell to a second low voltage supply node.

The method starts at 1110, and moves on to 1120 where the low side switches in the first and second sets of driver stages are switched on. The high side switch(es) in the first set of driver stages is/are switched off at 1130, and the high side switch(es) in the second set of driver stages is/are configured to provide a load between the I/O node of the I/O cell and the second high voltage supply node at 1140. A current source is then operably coupled to the second high voltage supply node at 1150, and a voltage level at at least one of the I/O node and the second high voltage supply node is detected at 1160. The method then ends at 1170.

Figure 12:
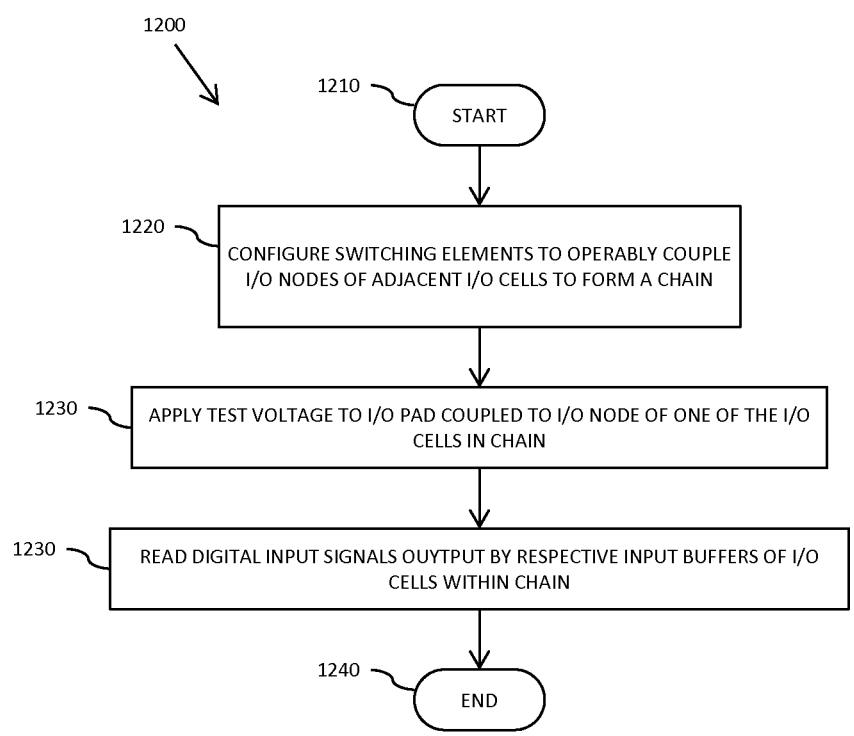
FIG. 12 illustrates a simplified flowchart of an example of a further method of providing on-chip test functionality for at least one I/O cell within an integrated circuit device.

Referring now to FIG. 12 there is illustrated a simplified flowchart 1200 of an example of a further method of providing on-chip test functionality for a plurality of I/O cells within an integrated circuit device, for example as may be implemented with a plurality of the I/O cell illustrated in FIG. 1. In particular, the method relates to a method of providing on-chip test functionality for a plurality of I/O cells within an integrated circuit device, each I/O cell comprising:

- a first set of driver stages comprising at least one driver stage; each driver stage of the first set comprising a high side switch controllable to couple an I/O node of the I/O cell to a first high voltage supply node and a low side switch controllable to couple the I/O node of the I/O cell to a first low voltage supply node;
- a second set of driver stages comprising at least one driver stage; each driver stage of the second set comprising a high side switch controllable to couple the I/O node of the I/O cell to a second high voltage supply node and a low side switch controllable to couple the I/O node of the I/O cell to a second low voltage supply node; and
- at least one switching element operably coupled between the I/O node of the I/O cell and an I/O node of at least one adjacent I/O cell.

The method starts at 1210, and moves on to 1220 where the switching elements are configured into a closed configuration to operably couple together I/O nodes of adjacent I/O cells such that the I/O nodes of the I/O cells are operably coupled in a chain. Next, at 1230, a test voltage is applied to an I/O pad operably coupled to an I/O node of one of the I/O cells within the chain of I/O cells. The digital input signals output by respective input buffers of the I/O cells within the chain of I/O cells are then read at 1230. By reading the digital input signals output by the respective input buffers of the I/O cells within the chain, their respective level ("0" or"1") may be determined and can be compared to the expected level for the test voltage applied to the I/O pad. By ramping the test voltage applied to the I/O pad up and down, the digital input voltage level values Vil, Vih and input hysteresis can be exactly measured for each I/O cell. The method then ends at 1240.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device.

Also for example, the examples, or portions thereof, may implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An input/output cell for performing on-chip testing within an integrated circuit device comprising:
   a first set of driver stages comprising at least one driver stage; each driver stage of the first set comprising a high side switch controllable to couple an input/output node of the input/output cell to a first high voltage supply node and a low side switch controllable to couple the input/output node of the input/output cell to a first low voltage supply node; and
   a second set of driver stages comprising at least one driver stage; each driver stage of the second set comprising a high side switch controllable to couple the input/output node of the input/output cell to a second high voltage supply node and a low side switch controllable to couple the input/output node of the input/output cell to a second low voltage supply node; and
   the high side and low side switches of the first set of driver stages being controllable independently of the high side and low side switches of the second set of driver stages.

2. The input/output cell of claim 1, wherein the input/output cell further comprises at least a first switching element operably coupled between the input/output node of the input/output cell and an input/output node of at least one adjacent input/output cell.

3. The input/output cell of claim 1, wherein the input/output cell further comprises at least a second switching element operably coupled between the input/output node of the input/output cell and at least one on-chip test resource.

4. An integrated circuit device comprising at least one input/output cell according to claim 1.

5. The integrated circuit device of claim 4, wherein the integrated circuit device comprises a plurality of input/output cells, wherein:
   the input/output node of each input/output cell is operably coupled to a respective input/output pad;
   the first high voltage supply nodes of the input/output cells are operably coupled to at least a first high voltage supply pad of the integrated circuit device;
   the second high voltage supply nodes of the input/output cells are operably coupled to at least a second high voltage supply pad of the integrated circuit device;
   the first low voltage supply nodes of the input/output cells are operably coupled to at least a first low voltage supply pad of the integrated circuit device; and
   the second low voltage supply nodes of the input/output cells are operably coupled to at least a second low voltage supply pad of the integrated circuit device.

6. The integrated circuit device of claim 4, wherein the integrated circuit device comprises at least one on-chip test resource operably coupled to the input/output node of the at least one input/output cell via the at least second switching element and arranged to perform a high output voltage drive strength test.

7. The integrated circuit device of claim 6, wherein the at least one on-chip test resource is arranged to:
   switch on the high side switches in the first and second sets of driver stages within the at least one input/output cell;
   switch off the at least one low side switch in the first set of driver stages within the at least one input/output cell;
   configure the at least one low side switch in the second set of driver stages within the at least one input/output cell to provide a load between the input/output node of the input/output cell and the second low voltage supply node;
   operably couple a current sink to the second low voltage supply node; and
   detect a voltage level at at least one of the input/output node of the at least one input/output cell and the second low voltage supply node.

8. The integrated circuit device of claim 6, wherein the at least one on-chip test resource is arranged to:
   switch on the low side switches in the first and second sets of driver stages within the at least one input/output cell;
   switch off the at least one high side switch in the first set of driver stages within the at least one input/output cell;
   configure the at least one high side switch in the second set of driver stages within the at least one input/output cell to provide a load between the input/output node of the input/output cell and the second high voltage supply node;
   operably couple a current source to the second high voltage supply node; and
   detect a voltage level at at least one of the input/output node of the at least one input/output cell and the second high voltage supply node.

9. The integrated circuit device of claim 4, wherein the integrated circuit device comprises at least one on-chip test resource operably coupled to the input/output node of the at least one input/output cell via the at least second switching element and arranged to detect leakage current at the input/output node of the at least one input/output cell.

10. The integrated circuit device of claim 9, wherein the at least one on-chip test resource is arranged to:
  operably couple one of a current sink and a current source to an input node of the at least one on-chip test resource;
  configure the at least second switching element of the at least one input/output cell to decouple the input/output node of the at least one input/output cell from the input node of the at least one on-chip test resource;
  detect a voltage level at the input node of the at least one on-chip test resource;
  configure the at least second switching element of the at least one input/output cell to operably couple the input/output node of the at least one input/output cell to the input node of the at least one on-chip test resource; and
  detect a voltage level at the input node of the at least one on-chip test resource.

11. A method of providing on-chip test functionality for a plurality of input/output cells within an integrated circuit device, each input/output cell comprising:
  a first set of driver stages comprising at least one driver stage; each driver stage of the first set comprising a high side switch controllable to couple an input/output node of the input/output cell to a first high voltage supply node and a low side switch controllable to couple the input/output node of the input/output cell to a first low voltage supply node;
  a second set of driver stages comprising at least one driver stage; each driver stage of the second set comprising a high side switch controllable to couple the input/output node of the input/output cell to a second high voltage supply node and a low side switch controllable to couple the input/output node of the input/output cell to a second low voltage supply node; and
  at least one switching element operably coupled between the input/output node of the input/output cell and an input/output node of at least one adjacent input/output cell,
wherein the method comprises:
  configuring the switching elements into a closed configuration to operably couple together input/output nodes of adjacent input/output cells such that the input/output nodes of the input/output cells are operably coupled in a chain;
  measuring at least one input/output characteristic at an input/output pad operably coupled to an input/output node of one of the input/output cells within the chain of input/output cells; and
  iteratively configuring a switching element within an input/output cell at an end of the chain of input/output cells to decouple the input/output node of the input/output cell at the end of the chain and re-measuring the at least one input/output characteristic at the input/output node of the one of the input/output cells within the chain of input/output cells upon each decoupling of an input/output node of an input/output cell at the end of the chain.

* * * * *